United States Patent [19]

Soneda et al.

[11] Patent Number: 4,578,597
[45] Date of Patent: Mar. 25, 1986

[54] LARGE AMPLITUDE PULSE GENERATING CIRCUITS

[75] Inventors: Mitsuo Soneda, Zama; Manami Fukuzawa, Aiko; Takaji Ohtsu, Hatano, all of Japan

[73] Assignee: Sony Corporation, Tokyo, Japan

[21] Appl. No.: 552,036

[22] PCT Filed: Mar. 5, 1983

[86] PCT No.: PCT/JP83/00068
§ 371 Date: Nov. 2, 1983
§ 102(e) Date: Nov. 2, 1983

[87] PCT Pub. No.: WO83/03174
PCT Pub. Date: Sep. 15, 1983

[30] Foreign Application Priority Data
Mar. 5, 1982 [JP] Japan ............... 57-34765

[51] Int. Cl.$^4$ ............... H03K 3/017; H03K 5/04
[52] U.S. Cl. ............... 307/265; 307/263; 307/246; 307/268; 307/270
[58] Field of Search ............... 307/468, 481, 260, 265, 307/268, 270, 279, 296 A, 234, 246, 355, 352, 353, 584, 575, 577, 529, 263

[56] References Cited

U.S. PATENT DOCUMENTS

| | | | |
|---|---|---|---|
| 3,842,411 | 10/1974 | Naito | 307/270 |
| 3,852,625 | 12/1974 | Kubo | 307/481 |
| 3,932,773 | 1/1976 | Lüscher et al. | 307/265 |
| 3,937,982 | 2/1976 | Nakajima | 307/481 |
| 4,245,168 | 1/1981 | Waldron | 307/270 |
| 4,256,976 | 3/1981 | Maggi | 307/270 |
| 4,412,139 | 10/1983 | Horninger | 307/270 |

Primary Examiner—Stanley D. Miller
Assistant Examiner—Timothy P. Callahan
Attorney, Agent, or Firm—Hill, Van Santen, Steadman & Simpson

[57] ABSTRACT

A pulse generating circuit comprises a first series connection of a first switching element (3:13) and a second switching element (4), a second series connection of a capacitive element (5) and a third switching element (6) coupled with a connecting point between the first and second switching elements, an amplifying element (7) having input and output terminals connected to both ends of the capacitive element (5), respectively, and a fourth switching element (8) connected to the output end of the amplifying element (7), and is supplied with a first input signal varying in level through the control terminals of the first and third switching elements (3:13, 6) and a second input signal varying in level through the control terminals of the second and fourth switching elements (4, 8), thereby to obtain a pulse having the width corresponding to the time interval from a variation in the level of the first input signal to a variation in the level of the second input signal at the output end of the amplifying element (7).

4 Claims, 12 Drawing Figures

FIG. 3
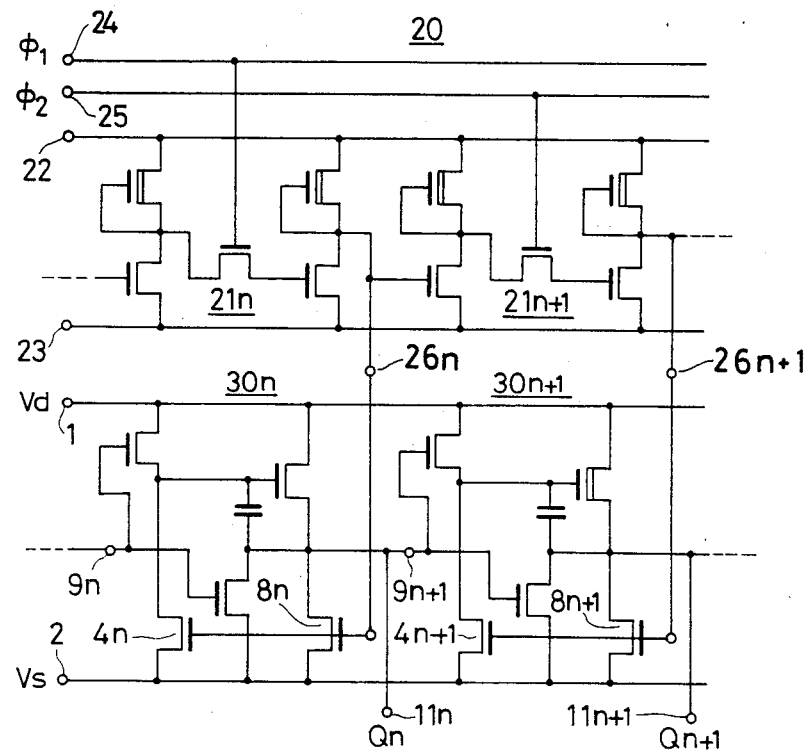
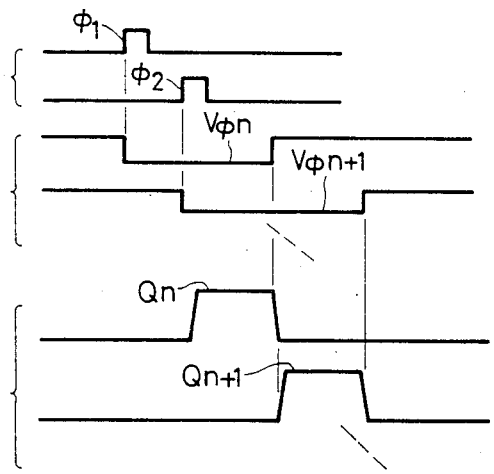
FIG. 4A
FIG. 4B
FIG. 4C

LARGE AMPLITUDE PULSE GENERATING CIRCUITS

TECHNICAL FIELD

This invention relates to a pulse generating circuit which can produce a pulse having relatively large amplitude and appearing in a predetermined phase and is suitable to be used for forming a driving circuit arrangement for a solid state image pickup device or a liquid crystal displaying device.

TECHNICAL BACKGROUND

A solid state image pickup device in which a plurality of photoelectric converters arranged in horizontal and vertical rows and a charge transfer device are contained and charge obtained in the photoelectric converters is transferred by the charge transfer device so as to produce an image pickup signal output, a liquid crystal displaying device in which a voltage is supplied to selected portions of a liquid crystal part formed into a flat panel so as to display a desired pattern thereon and so on, are usually driven by a series of pulse voltages appearing successively with a predetermined phase diference between each successive two of them. In such cases, it is required for each of the pulse voltages to have relatively large amplitude, such as being 10–40 volts, and a driving circuit arrangement provided for driving or scanning such a solid state image pickup device or liquid crystal displaying device is required to produce driving pulses each having relatively large amplitude accurately with reduced power consumption.

The driving circuit arrangement for the solid state image pickup device or the liquid crystal displaying device has been usually composed of a shift register and previously proposed such driving circuit arrangements are unsatisfactory to comply with the above mentioned requirement.

DISCLOSURE OF THE INVENTION

Accordingly, it is an object of the present invention to provide a novel pulse generating circuit capable of being used for constituting a driving circuit arrangement which produces a series of pulses each having relatively large amplitude accurately with reduced power consumption.

A pulse generating circuit according to the present invention which comprises first and second switching elements connected in series to each other, a series connection of a third switching element and a capacitive element coupled with a connected point between the first and second switching elements, an amplifying element supplied with the voltage from a power source and having input and output terminals connected to both ends of the capacitive element, respectively, and a fourth switching element connected to the output end of the amplifying element, is supplied with a first input signal varying in level through the control terminals of the first and third switching elements and a second input signal varying in level through the control terminals of the second and fourth switching elements, thereby to obtain a pulse having the width corresponding to the time interval from a variation in the level of the first input signal to a variation in the level of the seocnd input signal at the output terminal of the amplifying element.

With the pulse generating circuit according to the present invention thus constituted, such a pulse as to have relatively large amplitude obtained by making the most of the voltage from the power source and the width determined by the variations in the levels of the first and second input signals can be obtained surely in a phase defined by the variations in the levels of the first and second input signals and the electric power consumed during the pulse generating operation thereof can be considerably reduced. Further, in case that a plurality of the pulse generating circuits according to the present invention are used in the manner of series connection, pulses forming a plurality of groups with different phases can be obtained successively with a small overlapping portion between each successive two of them. Accordingly, the pulse generating circuit according to the present invention can be employed to constitute such a driving circuit arrangement as aforementioned and, in such case, the driving pulses each having the relatively large amplitude can be obtained in response to input signals each having reduced amplitude.

BRIEF DESCRIPTION OF THE DRAWINGS

FIG. 3 is a circuit diagram showing a portion of an example of a driving circuit comprising a plurality of the pulse generating circuits shown in FIG. 1 and shift registers;

FIGS. 4A to 4C are waveform diagrams used for explaining the operation of the driving circuit shown in FIG. 3;

EMBODIMENTS MOST PREFERABLE FOR WORKING OF THE INVENTION

Now, preferred embodiments of the present invention will be described with reference to the accompanying drawings hereinafter.

Figure 1:
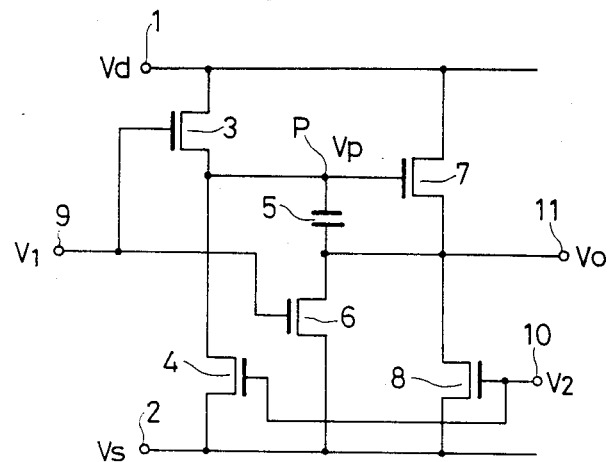
FIG. 1 is a circuit diagram showing an embodiment of pulse generating circuit according to the present invention.

FIG. 1 shows one example of a pulse generating circuit according to the present invention, and the example comprises insulated gate field effect transistors of the N-channel type (hereinafter referred to as MOS FETs). In this example, drain-source paths of MOS FETs 3 and 4 which act as first and second switching elements, respectively, are connected in series to each other between a source voltage supplying terminal 1 through which a source voltage $V_d$ is supplied from a power source and a reference voltage supplying terminal 2 through which a reference voltage $V_s$ is supplied. A capacitive element 5 and a drain-source path of MOS FET 6 which acts as a third switching element are connected in series to each other between a connecting point between the MOS FETs 3 and 4 and the reference voltage supplying terminal 2. A gate and a source of a MOS FET 7 which acts as an amplifying element are connected to both ends of the capacitive element 5, respectively, and a drain of the MOS FET 7 is connected to the source voltage supplying terminal 1. A drain-source path of a MOS FET 8 which acts as a fourth switching element is connected between the source of the MOS FET 7 and the reference voltage supplying terminal 2. Further, the gates of the MOS FETs 3 and 6 are connected in common to a first input terminal 9 and the gates of the MOS FETs 4 and 8 are connected in common to a second input terminal 10. Besides, an output terminal 11 is derived from the source of the MOS FET 7.

Figure 2A:
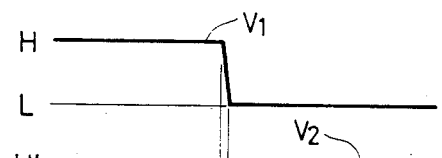
FIGS. 2A to 2D are waveform diagrams used for explaining the operation of the embodiment shown in FIG. 1.
Figure 2B:
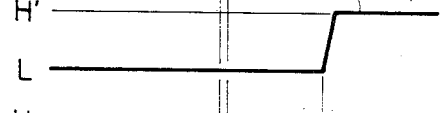

In the pulse generating circuit thus composed, a first input signal $V_1$ varying in level at an instant $t_1$ as shown in FIG. 2A and a second input signal $V_2$ varying in level at an instant $t_2$ as shown in FIG. 2B are supplied to the first and second input terminals 9 and 10, respectivly. The first input signal $V_1$ falls to a low level L nearly equal to the level of the reference voltage $V_s$ from a high level H nearly equal to the level of the source voltage $V_d$ at the instant $t_1$ and the second input signal $V_2$ rises to a high level H' from the low level L at the instant $t_2$.

Figure 2C:

Before the instant $t_1$, the MOS FETs 3 and 6 are in the ON state, while the MOS FETs 4 and 8 are in the OFF state, because the first input signal $V_1$ takes the high level H and the second input signal $V_2$ takes the low level L. In this situation, the capacitive element 5 is charged through the MOS FET 3 by the source voltage $V_d$ and therefore a voltage $V_p$ at a connecting point P between the capacitive element 5 and the gate of the MOS FET 7 takes a first high level $H_1$ nearly equal to the level of the source voltage $V_d$, as shown in FIG. 2C. Further, since the MOS FET 6 is in the ON state, a voltage $V_o$ at the output terminal 11 takes the low level L, as shown in FIG. 2D.

At the instant $t_1$, the first input signal $V_1$ falls to the low level L from the high level H and therefore the MOS FET 6 is turned off. Accordingly, both the MOS FETs 6 and 8 are in the OFF state, so that the voltage at the source of the MOS FET 7, that is, the voltage $V_o$ at the output terminal 11 increases in level and consequently the voltage $V_p$ at the connecting point P also increases in level. In this condition, such a positive feedback operation as increase in the level of the voltage at the source of the MOS FET 7→ increase in the level of the voltage $V_p$ at the connecting point P→ increase in level of the current flowing through the drain-source path of the MOS FET 7→ increase in the level of the voltage at the source of the MOS FET 7, is performed and therefore the level of the voltage at the source of the MOS FET 7 increases hastily. The voltage $V_p$ at the connecting point P rises to a second high level $H_2$ which is almost twice as high as the level of the source voltage $V_d$ (to be exact, $H_2 = V_d - V_{th} + (C/C + C_s)$. $V_d$, where $V_{th}$ stands for the threshold voltage of the MOS FET 7, C stands for the capacitance of the capacitive element 5, and $C_s$ stands for the stray capacitance at the source of the MOS FET 7) at an instance $t_1'$ immediately after the instant $t_1$, as shown in FIG. 2C, and the level of the voltage at the source of MOS FET 7 rapidly reaches to the level of the source voltage $V_d$. As a result of this, the voltage $V_o$ at the output terminal 11 rapidly rises to reach to the high level H at the instant $t_1'$, as shown in FIG. 2D. In this case, since the MOS FET 6 is not turned off as long as the first input signal $V_1$ takes levels other than a level almost equal to the low level L, there is little an overlapping period between the falling portion of the first input signal $V_1$ and the rising portion of the voltage $V_o$ at the output terminal 11.

Then, at the instant $t_2$, the second input signal $V_2$ rises to the high level H' from the low level L and therefore the MOS FETs are turned on. Accordingly, the voltage $V_p$ at the connecting point P falls to the low level L from the second high level $H_2$ as shown in FIG. 2C and the voltage at the source of the MOS FET 7 falls to the low level L. The voltage $V_o$ at the output terminal 11 rapidly falls from the high level H so as to reaches to the low level L at an instant $t_2'$, as shown in FIG. 2D. The voltage $V_p$ at the connecting point P and the voltage at the source of the MOS FET 7 lower together through the capacitive element 5 so that their falling portions become very steep and the time interval from the instant $t_2$ to the instant $t_2'$ is extremely short. Then, the first and second input signals $V_1$ and $V_2$ take again the high level H and low level L, respectively.

Figure 2D:
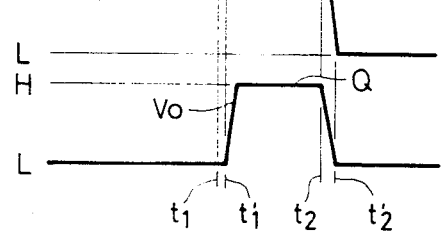

In the manner described above, a pulse Q which rises in response to the variation in the level of the first input signal $V_1$ and falls in response to the variation in the level of the second input signal $V_2$, as shown in FIG. 2D, is obtained from the output terminal 11. This pulse Q has the width which is determined in response to the first and second input signals $V_1$ and $V_2$, and relatively large amplitude which is obtained by making the most of the source voltage $V_d$ and nearly equal to $V_d - V_s$. Accordingly, the pulse generating circuit shown in FIG. 1 is operative to produce, by utilizing the voltage boosting operation of the capacitive element 5, a pulse having relatively large amplitude obtained by making the most of the source voltage $V_d$ in response to the veriation in the level of the input signal. During the pulse producing operation of this circuit, a current directed through the circuit to the reference voltage supplying terminal 2 from the source voltage supplying terminal 1 does not always flow but flows for only a relatively short period and therefore power consumption therein is extremely reduced. Further, since the second input signal $V_2$ is required only to be capable of turning the MOS FETs 4 and 8 on or off, the high level H' thereof can be set to be not so high.

FIG. 3 shows a portion of one example of a driving circuit formed with a combination of a plurality of such pulse genarating circuits according to the present invention as mentioned above and a shift register circuit, which is operative to produce a plurality of pulses successively in different phases. In FIG. 3, a shift register 20 comprises a plurality of unit blocks $21_n$, $21_{n+1}$, - - - connected in series to form a multi-stage configuration between a source voltage supplying terminal 22 and a reference voltage supplying terminal 23. The unit blocks $21_n$, $21_{n+1}$, - - - are supplied alternately with clock pulses $\phi_1$ and $\phi_2$ appearing in respective phases different from each other, as shown in FIG. 4A through clock supplying terminal 24 and 25, respectively, and output pulses $V_{\phi n}$, $V_{\phi n+1}$, - - - as shown in FIG. 4B are obtained successively at output terminals $26_n$, $26_{n+1}$, - - -, respectively.

In connection with the shift register 20, pulse generating circuits $30_n$, $30_{n+1}$, - - - each corresponding to the pulse generating circuit shown in FIG. 1 are provided to form a series connection thereof in which an output terminal of one of each two at successive stages, for example, an output terminal $11_n$ is coupled with an input terminal of the other of each two at successive stages, for example, an input terminal $9_{n+1}$. In this example, the pulse generating circuits $30_n$, $30_{n+1}$, - - - have in common the source voltage supplying terminal 1 and the reference voltage supplying terminal 2, and the output terminals $26_n$, $26_{n+L}$, - - - of the shift register 20 are connected to second input terminals $10_n$, $10_{n+1}$, - - - of the pulse generating circuits $30_n$, $30_{n+1}$, - - - , respectively. Accordingly, each of the pulse generating circuits $30_n$, $30_{n+1}$, - - - is supplied with an output pulse obtained from one at the preceding stage as a first input signal and one of the output pulses $V_{\phi n}$, $V_{\phi n+1}$, - - - obtained from the corresponding unit block of the shift register 20 as a second input signal, and performs the pulse generating operation in the same manner as mentioned above. As a result of this, with relation to the output pulses $V_{\phi n}$, $V_{\phi n+1}$, - - - obtained at the output terminals $26_n$, $26_{n+1}$, - - - of the shift register 20 as shown in FIG. 4B, pulses $Q_n$, $Q_{n+1}$, - - - each of which rises in level in response to the falling edge of the output pulse obtained from the pulse generating circuit at the preceding stage and falls in level in response to the rising edge of the corresponding one of the output pulses $V_{\phi n}$, $V_{\phi n+1}$, - - - from the shift register 20, as shown in FIG. 4C, are obtained at the output terminals $11_n$, $11_{n+1}$, - - - of the pulse generating circuits $30_n$, $30_{n+1}$, - - - . In this case, since the output pulses $V_{\phi n}$, $V_{\phi n+1}$, - - - from the shift register 20 are required only to be capable of turning MOS FETs $4_n$, $4_{n+1}$, - - - and $8_n$, $8_{n+1}$, - - - contained in the pulse generating circuits $30_n$, $30_{n+1}$, - - - , respectively, on or off, the amplitude of each of the output pulses $V_{\phi n}$, $V_{\phi n+1}$, - - - can be set to be relatively small.

Figure 5:
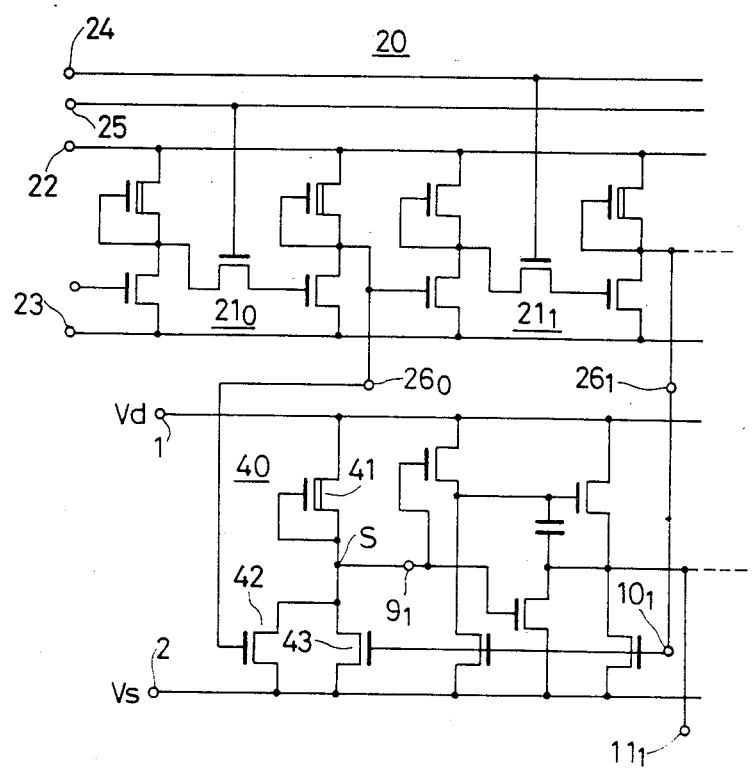
FIG. 5 is a circuit diagram showing a portion of another example of a driving circuit comprising a plurality of the pulse generating circuits shown in FIG. 1 and shift registers.

In the series connection of the pulse generating circuits $30_n$, $30_{n+1}$, - - - forming a multistage configuration as described above, it is necessary to supply independently with a first input signal to the first input terminal $9_1$ of the pulse generating circuit $30_1$ which is provided at the first stage. FIG. 5 shows an example of a circuit for supplying with the first input signal to the pulse generating circuit $30_1$ at the first stage. In this example, a setting up circuit 40 is provided between the source voltage supplying terminal 1 and the reference voltage supplying terminal 2 at a stage taking precedence of the first stage at which the pulse generating circuit $30_1$ is located. The setting up circuit 40 comprises MOS FETs 41, 42 and 43 connected in such a menner as shown in FIG. 5, wherein a connecting point S among the source of the MOS FET 41, the drain of the MOS FET 42 and the drain of the MOS FET 43 is coupled with the first input terminal $9_1$ of the first pulse generating circuit $30_1$. The gate of the MOS FET 42 is connected to the output terminal $26_0$ of the unit block $21_0$ at the foremost stage in the shift register 20, and the gate of the MOS FET 43 is connected to the output terminal $26_1$ of the unit block $21_1$ at the first stage in the shift register 20.

With the configuration mentioned above, during a period in which output pulses $V_{\phi 0}$ and $V_{\phi 1}$ obtained at the output terminals $26_0$ and $26_1$, respectively, in the same manner as the output pulses $V_{\phi n}$ and $V_{\phi n+1}$ shown in FIG. 4B overlap upon each other so that each of the voltages at the output terminals $26_0$ and $26_1$ takes the low level, both the MOS FETs 42 and 43 are in the OFF state and the voltage at the connecting point S takes the high level H. After that, when the output pulse $V_{\phi 0}$ obtained at the output terminal $26_0$ has its rear edge and the voltage at the output terminal $26_0$ is turned to the high level, the MOS FET 42 is turned on and therefore the voltage at the connecting point S takes the low level L. This voltage obtained at the connecting point S and varying in level to the low level L from the high level H is supplied to the first input terminal $9_1$ of the pulse generating circuit $30_1$ at the first stage as the first input signal.

Figure 6:
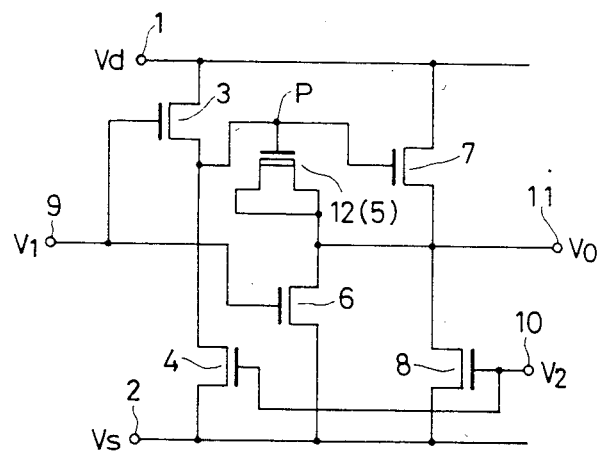
FIG. 6 is a circuit diagram showing the embodiment shown in FIG. 1 with more concrete configuration of a portion thereof.

FIG. 6 shows an practical example of the pulse generating circuit shown in FIG. 1 in which the capacitive element 5 is composed of a capacitance between a gate and a substrate of a MOS FET 12 of the depletion type having its drain and source coupled with each other. In this case, effective voltage boosting operation can be obtained by connecting the gate of the MOS FET 12 to the connecting point S.

Figure 7:
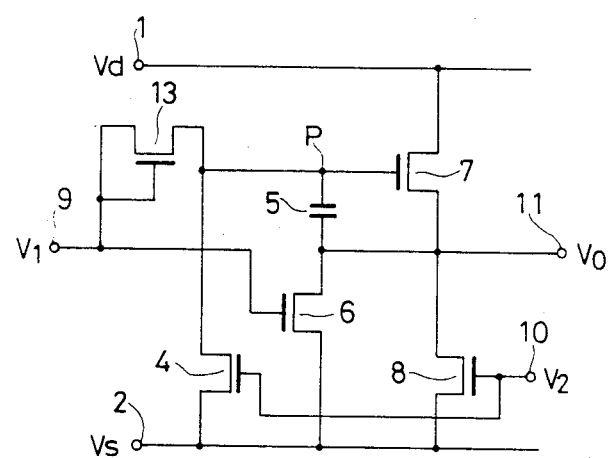
FIG. 7 is a circuit diagram showing another embodiment of pulse generating circuit according to the present invention.

FIG. 7 shows another example of the pulse generating circuit according to the present invention. In FIG. 7, elements and parts corresponding to those of FIG. 1 are marked with the same references. In this example, a MOS FET 13 with its drain and gate coupled with each other is used in place of the MOS FET 3 of FIG. 1. The drain and gate of the MOS FET 13 are connected to the first input terminal 9 and a source of the MOS FET 13 is connected to the drain of the MOS FET 4. This example also operates to produce a pulse in the same manner as the example shown in FIG. 1, when the first input signal $V_1$ supplied to the first input terminal 9 takes the high level H which is nearly equal to the level of the source voltage $V_d$.

APPLICABILITY FOR INDUSTRIAL USE

As described above, the pulse generating circuit according to the present invention can produce a pulse appearing in a predetermined phase with relatively large amplitude and a predetermined width surely with reduced power consumption, and accordingly is quite suitable for being used to constitute in cooperation with a shift register a driving circuit arrangement for a solid state image pickup device, a liquid crystal displaying device and so on, and other driving circuit arrangements which are required to produce a series of pulses, each of which has relatively large amplitude, successively in different phases with reduced power consumption.

We claim:

1. A pulse generating circuit comprising a series connection of a first switching element (3:13) and a second switching element (4), between first and second power supply terminals, a series connection of a capacitive element (5) and a third switching element (6) coupled between a connecting point between the first and second switching elements and one of said power supply terminals, an amplifying (7) having input and output terminals connected to both ends of the capacitive element (5), respectively, and a fourth switching element (8) connected between the output end of the amplifying element (7) and said one power supply terminal, means for supplying a first input signal to the control terminals of the first and third switching elements and for supplying a second input signal to the control terminals of the second and fourth switching elements, whereby a pulse having a width corresponding to the time interval from a variation in the level of the first input signal to a variation in the level of the second input signal is obtained at the output end of the amplifying element (7).

2. A pulse generating circuit according to claim 1, wherein each of the first, second, third and fourth switching elements (3:13, 4, 6, 8) and the amplifying element (7) is composed of an insulated gate field effect transistor.

3. A pulse generating circuit according to claim 2, wherein the first switching element (13) is composed of an insulated gate field effect transistor having a drain and a gate coupled with each other and a source connected to the second switching element (4), and the first input signal is supplied to the drain and the gate coupled with each other.

4. A pulse generating circuit according to claim 1, wherein the capacitive element (5) is composed of a insulated gate field effect transistor (12) having a drain and a source coupled with each other.

* * * * *